United States Patent [19]
Anand

[11] 3,968,272
[45] July 6, 1976

[54] ZERO-BIAS SCHOTTKY BARRIER DETECTOR DIODES

[75] Inventor: Yoginder Anand, Woburn, Mass.

[73] Assignee: Microwave Associates, Inc., Burlington, Mass.

[22] Filed: Jan. 25, 1974

[21] Appl. No.: 436,431

[52] U.S. Cl. .................................. 427/84; 427/88; 427/124; 357/15; 357/67
[51] Int. Cl.² .......................................... B05D 5/12
[58] Field of Search ................ 117/215, 227, 107; 357/15, 67; 427/84, 88, 124

[56] References Cited
UNITED STATES PATENTS

| | | | |
|---|---|---|---|
| 3,274,670 | 9/1966 | Lepselter | 357/67 |
| 3,300,340 | 1/1967 | Calandrello et al. | 357/67 |
| 3,361,592 | 1/1968 | Quetsch, Jr. et al. | 357/67 |
| 3,558,366 | 1/1971 | Lepselter | 357/51 |
| 3,586,542 | 6/1971 | MacRae | 357/15 |
| 3,700,979 | 10/1972 | Saxena | 357/15 |
| 3,736,478 | 5/1973 | Veloric | 357/67 |
| 3,770,606 | 11/1973 | Lepselter | 357/15 |

Primary Examiner—Cameron K. Weiffenbach
Attorney, Agent, or Firm—Alfred H. Rosen; Frank A. Steinhilper

[57] ABSTRACT

Metal-silicide-silicon Schottky barrier diodes are made by a process which yields the characteristic of low barrier height, in the region of 0.15 volt, suitable for use without dc bias as a detector at microwave frequencies. Low barrier height metals, such as palladium, platinum and hafnium are processed through heat treatment steps which reduce the barrier height below that which is typical of point contact diodes.

10 Claims, 2 Drawing Figures

ZERO-BIAS SCHOTTKY BARRIER DETECTOR DIODES

BACKGROUND OF THE INVENTION

This invention relates in general to Schottky barrier diodes that are characterized by low barrier height (in the region 0.15 volt) suitable for use without dc bias as a detector at microwave frequencies and more particularly to a metal-silicide-silicon diode.

Schottky barrier diodes are particularly attractive for use in microwave circuit assemblies made with stripline, microstrip and similar kinds of transmission lines using conductors formed as strips on a dielectric substrate, because they may be used in the unpackaged chip form and they are bondable to the conductors used in such lines. However, additional dc bias circuitry that is presently required to bias Schottky barrier diodes to operate them as detectors in stripline, microstrip and like transmission line assemblies is expensive, complex, and affects adversely the overall performance of the diodes as detectors at microwave frequencies in such assemblies. The invention accordingly relates also to zero-bias bondable detector diodes, that can be used in stripline, microstrip and like transmission line assemblies without dc bias circuitry, and therefore without introducing any requirement for dc offset compensating circuitry.

Point contact, Schottky-barrier, and back diodes are used as mixers and detectors from UHF to millimeter frequencies. A discussion of properties of these devices appears in an article entitles "Microwave Mixer and Detector Diodes" by the present inventor and W. J. Moroney, Proc. IEEE, Vol. 59, No. 8, August, 1971, pages 1182–1190. At the present time, to my knowledge, there are no bondable zero bias detectors available.

Metal semiconductor contacts can be ohmic or rectifying. Those made on heavily doped semiconductors generally are ohmic, and such contacts made on lightly doped semiconductor materials exhibit rectifying behavior with an energy barrier existing between the metal and the semiconductor. Point contact and Schottky barrier diodes belong to the second (rectifying behavior) category.

Point contacts diodes are made by a pressure contact between a metal and a semiconductor body, and optimum whisker pressure is needed to obtain the rectifying barrier. Generally, point contact diodes are attractive for use at microwave frequencies because they have extremely low energy barrier between the metal and the semiconductor, and they can be used without dc bias as rectifiers (i.e.: they can be operated as zero bias detectors) at microwave frequencies. They are generally available only in packages which are not suitable for bonding to the conductors of stripline or microstrip transmission lines.

A Schottky barrier diode is formed by plating, evaporating or sputtering a variety of metals and alloys on n- or p-type semiconductor materials. All types of Schottky barrier diodes that are presently available exhibit energy barrier heights from about 0.24 volt to about 0.90 volt, and they all require an additional dc bias to operate them as detectors at microwave frequencies.

The energy barrier height of the Schottky barrier diode is governed approximately by the difference in the work function of the metal and that of the semiconductor (see U.S. Pat. No. 3,599,322; column 2, lines 19–22). In practice it is found that a prediction of rectifying properties based on the work functions of pure metals is not accurate. The actual barrier junction on silicon is in most cases a metal-silicide junction, and impurities are involved on both sides. The barrier height or forward voltage at which current starts (turn-on voltage) is therefore influenced by diffusion during processing. Thus, while choice of metals for low-barrier diodes can be helped by the work function theory, actual turn-on voltages are not predictable.

A relatively early article by Kahng and Lepselter entitled "Planar Epitaxial Silicon Schottky Barrier Diodes" (Bell System Technical Journal, Vol. 44, Sept. 1965, pages 1525–1528) describes formation of metal silicides by evaporation of the metal over the exposed silicon at temperatures of 300°C to 700°C. The silicide rectifying junctions have lower barrier height than pure metal junctions (0.87 volt for Pt-silicide-Si vs. 1.00 for Pt-Si, for example). It is noted, however, that the barrier height is usually increased by higher temperatures until it approaches the pure metal value. In the U.S. Pat. No. 3,599,056 of Lepselter and MacRae a metal-silicide is formed on n-type silicon at a temperature in excess of 400°C, usually of the order of 700°C to promote formation of the silicide layer (column 2, lines 8–25). Silicide forming metals suggested are Ni, Ti, Zr, Hf, and the six platinum group metals. The same teaching appears in U.S. Pat. Nos. 3,604,986 and 3,616,380 of Lepselter et al. Kahng and Lepselter's U.S. Pat. No. 3,290,127 describes a Schottky barrier diode using palladium silicide as the active contact layer producing the surface barrier with the semiconductor material. The silicide is formed in a palladium and silicon solid state reaction at 400°C or higher. Lepselter's U.S. Pat. No. 3,287,612 describes a use of platinum silicide formed in a solid phase reaction at a temperature between 500° and 600°C, to make an ohmic contact to p-type silicon.

D'Heurle, Esaki and Seki in U.S. Pat. No. 3,451,912 proposed to form a metal-silicide as the metal-semiconductor junction, using sputtered metal ions deposited in intimate contact with the surface of the semiconductor body (column 2, lines 47–51; column 3, line 4). The junction thus formed is stated to exhibit rectifying properties when —appropriately biased (column 3, lines 49–51). A threshold voltage in the order of 0.35 volt is stated for a molybdenum-silicon barrier diode (column 7, lines 40–42).

Crowell and Sze in U.S. Pat. No. 3,349,297 mention converting a portion of a platinum layer on silicon to platinum silicide to improve adherence of the layer. This patent suggests several metal-silicon combinations for making a rectifying surface barrier contact, but the significant teaching of the patent is to use two metals having relatively different barrier heights, one to form a surface barrier electrode, and the other as a guard ring to control the area and shape of the first, as well as to provide a means for making electrical contact to it (column 2, lines 36–40; column 4, lines 63–65).

Dhaka's U.S. Pat. No. 3,506,893 describes (column 5, lines 4–14) sintering platinum on silicon at about 550°C for 20 minutes to form an alloy of platinum and silicon (platinum silicide), for use as an ohmic contact or a Schottky-barrier diode (column 5, lines 31–36). This diode is a biased switching diode, operated with a voltage of (+)0.4 volts on its anode (column 5, lines 42–45), and a greater voltage barrier appears to be desired (column 5, lines 73–75).

Saxena's U.S. Pat. No. 3,700,979 provides a Schottky barrier diode having a high barrier height (approximately 0.90 volt) by annealing a film of hafnium on p-type silicon at a temperature between 450°C and 550°C. Saxena's U.S. Pat. No. 3,599,323 describes a hot carrier diode using a chromium-silicon barrier, which is stated to have low-turn-on voltage, about 0.27 volt, made by vapor-depositing chromium on p-type silicon. No temperature range is specified for the process.

GENERAL NATURE OF THE INVENTION

The invention provides a metal-silicide-silicon Schottky barrier diode for use without dc bias as a rectifier at microwave frequencies, comprising a body of silicon and a rectifying metal-semiconductor contact made of a silicide of a metal formed in the silicon while the silicon body is at a temperature below the eutectic for that silicide. Low barrier metals are most suitable. For p-type silicon the low barrier metals preferred are palladium and platinum. For n-type silicon the low barrier metal preferred is hafnium. According to the invention, it has been found that the desired zero-bias condition can be achieved by a process which includes the step of heat treating the silicon body on which the metal has been deposited, and thereby forming the metal-silicide, at a temperature which is substantially below the eutectic temperature for that metal silicide.

DETAILED DESCRIPTION OF THE DRAWINGS

Figure 1:
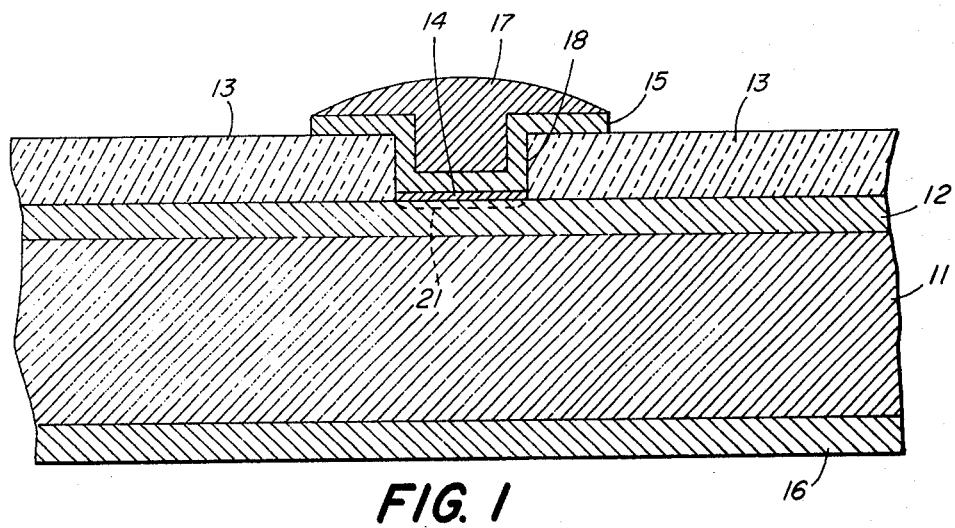
FIG. 1 is a greatly-enlarged sectional view of a Schottky Barrier diode.

FIG. 1 shows a body 11 of p(+)type substrate silicon carrying an epitaxial layer 12 of p-type silicon having epitaxial thickness between about $0.5\mu$ and $0.9\mu$, and epitaxial resistivity of about 0.22 ohm-cm., which in turn is covered by a layer 13 of glass having a window 18 in it. A layer 14 of palladium is on the epitaxial silicon 12 in the window 18. By heat treatment to be described, the palladium is sintered into and forms a solid solution 21 of palladium silicide with the p-type silicon 12.

A cover layer 15 of metal suitable for encapsulating the junction, such as nichrome or Ti-Mo-Au alloy, covers over the palladium layer 14 and the glass 13 surrounding the window 18, and a gold button 17 is bonded to this layer, to provide one electrode for the finished diode. The ohmic contact second electrode 16 is formed on the opposite or back side of the substrate silicon body 11, and it may be made of a chromium-gold alloy deposited by an evaporation-vapor deposit technique, or of nickel and gold as described below.

Silicon-Palladium Schottky barrier diodes as illustrated in the drawing were fabricated by evaporation technique. A 99.999% pure Palladium in wire form was used and the evaporation was conducted at a pressure of $1 \times 10^{-7}$ torr. The palladium was evaporated to a thickness of 2000 – 3000A onto the epitaxial layer 12, while the semiconductor body 11 and epitaxial layer 12 were held at a temperature between 100°C and 150°C. The palladium coated wafer 11, 12 bearing the palladium layer 14 was then placed on a Hughes strip heater Model HVT-600 and baked for 10–15 minutes at 325°C± 25°C temperature under a forming gas (20% $H_2$, 80% $N_2$) atmosphere, to form the palladium-silicide 21. Unwanted palladium on the outer surface of the glass layer 13 and the excess palladium in the window 18 was removed by dipping the wafer in aqua regia. Then the cover layer 15, in this example Ti-Mo-Au, was sputtered over the device for the overlay contact and excess Ti-Mo-Au was etched by a typical photo step as is known in the art. Ohmic contact 16 to the p(+) substrate 11 was obtained by electroplating nickel and gold, after etching the substrate 11 to 5 mil. thickness.

A palladium-silicide Schottky barrier formed on p-type silicon under the above-described novel conditions of heat treatment at a temperature below the eutectic for that silicide results in an extremely low barrier Schottky diode. This discovery has several important consequences. For the first time, there is provided a Schottky barrier diode that can be operated as a zero bias detector at microwave frequencies, fully rivalling and even surpassing the dc characteristics of silicon point-contact diodes. Like the latter, it exhibits self-protection in that it will reflect most of incident RF power at high power levels, resulting in a high burnout Schottky barrier diode. The importance of this property is discussed in an article by the present inventor and C. Howell entitled "The Real Culprit in Diode Failure" - Microwave, August, 1970. It can also be used as a mixer under extremely low local oscillator power levels. It removes the need to provide dc bias circuitry, and dc off-set components with their circuitry, which is especially advantageous in the area of so-called "printed" circuits or the like which use conductors formed as strips on a dielectric substrate, and to which Schottky diodes, being easy to make of "planar" construction, can readily be bonded. Hence, the invention provides for the first time a zero bias bondable detector diode.

Figure 2:
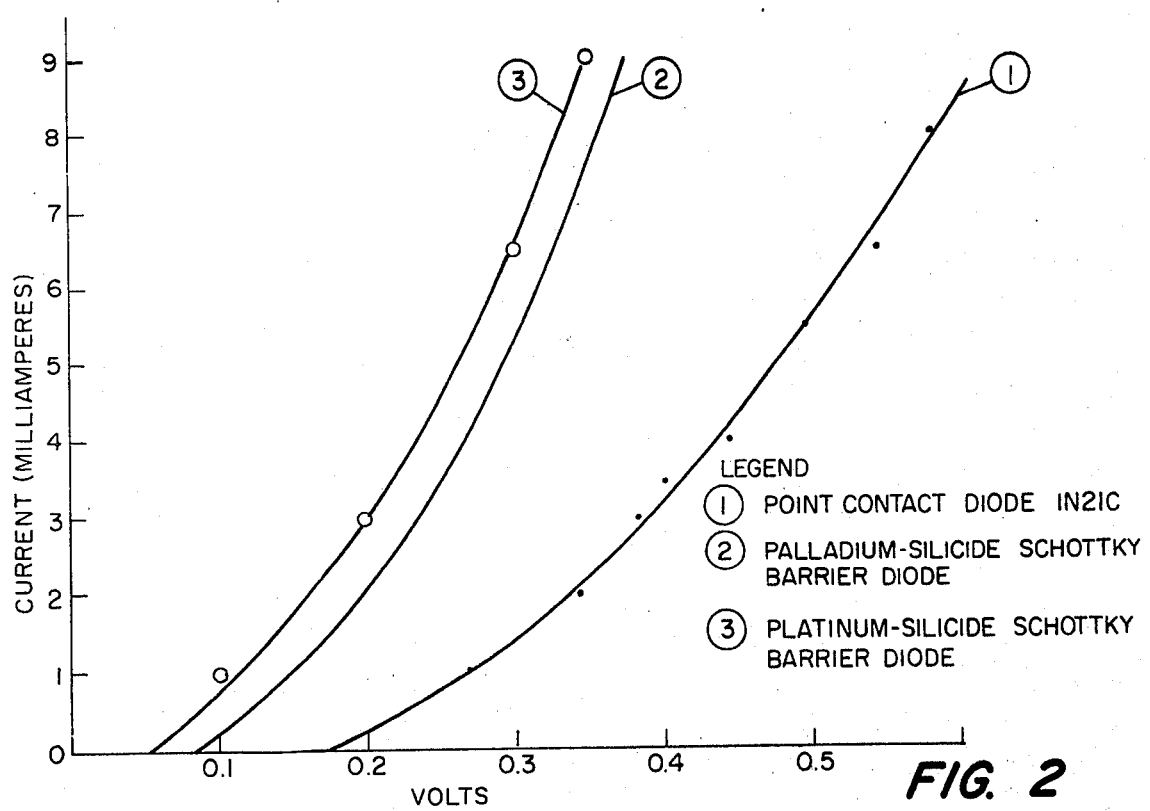
FIG. 2 is a set of curves comparing diodes of the invention with a prior-art point contact diode.

FIG. 2 shows the current vs. voltage characteristics of two Schottky Barrier diodes made according to the invention as compared with the corresponding characteristic of the type 1N21C point contact diode. Curve 1, for the point contact diode is taken from Saxena's U.S. Pat. No. 3,599,323, FIG. 3. Curve 2 shows the I-V characteristic for a palladium-palladium silicide-silicon diode according to the invention. Curve 3 shows the I-V characteristic for a platinum-platinum silicide-silicon diode according to the invention. The superiority of the diodes of the invention over the point contact diode is clearly evident.

In making zero-bias diodes according to the invention, it is preferred to start with a metal-silicon combination exhibiting a barrier height not greater than about 0.3 volt to 0.4 volt. Thus, palladium, which exhibits a barrier height of 0.35 volt on p-type silicon, is a preferred choice. Suitable p-type silicon will have resistivity in the range 0.1 to 0.3 ohm-cm; a resistivity of 0.22 ohm-cm has been used. According to "Constitution of Binary Alloys" by Dr. Phil. Max Hansen, Metallurgy and Metallurgical Engineering Series, McGraw Hill Book Co., Inc., 1958, at page 1126, Fig. 611 for Palladium-Silicide, the lowest eutectic temperature for palladium-silicide is 720°C. In the method of the present invention, as described above, the substrate temperature for deposition, and the temperature at which the silicide is formed, are both substantially below 720°C. The time interval over which the body 11, 12, 13 with deposited palladium 14 is held at the formation temperature, that is, the formation time, can be from about 2 minutes to about 15 minutes, and a range from 5–15 minutes is a preferred practical range. Longer formation time may degrade the sensitivity (TSS). Also, if the diode is being formed on an epitaxial layer 12, the silicide 20 should not be permitted to penetrate the layer into the p(+) substrate 11, where it would become an ohmic contact. Following the method of the invention, palladium-silicon Schottky barrier diodes have been made which exhibit a barrier height ranging between 0.15 and 0.20 volt.

The following chart indicates the comparative data for Schottky barrier diodes made according to the invention of palladium on p-type silicon, platinum on p-type silicon, and hafnium on n-type silicon, the silicon in each case being an epitaxial layer 12 of resistivity 0.22 ohm-cm on a substrate 11 lower-resistivity (0.0008 ohm-cm)

|  | DATA | Palladium | Platinum | Hafnium |
|---|---|---|---|---|
| (1) | Eutectic Temp. of Silicide | 720°C | 830°C | 800°C |
|  | Substrate Temp. on Deposition | 200°C | 200°C | 200°C |
|  | Formation Temperature | 325°+25°C | 425°±25°C | 400°±25°C |
| (2) | Formation Time | 2+ minutes | 5–15 minutes | 5–15 minutes |
|  | Barrier Height of Finished Diode | 0.15–0.20 volt | 0.15 volt | 0.15 volt |
|  | Barrier Height (Unworked) | 0.35 volt | 0.27 volt | 0.25 volt |

NOTES:
(1) Metal silicides occur in several distinct modes, or weight % ratios of silicon to metal (atomic ratios); the figure given in each case is the lowest found in the literature.
(2) 5–15 minutes preferred; shorter times are useful.

In each case, the barrier height achieved with the present invention is lower than that of known point contact diodes.

I claim:

1. A method of making a metal-silicide-silicon Schottky barrier diode having a barrier height about 0.15 volt, comprising the steps of:
   providing a body of silicon having resistivity between about 0.1 ohm-cm and 0.3 ohm-cm to receive a metal capable of forming a silicide with said body;
   maintaining said body at a first temperature not lower than approximately 100°C, and not higher than approximately 200°C;
   depositing on said body while said body is at said first temperature a metal having a barrier height between about 0.3 volt and 0.4 volt;
   raising the temperature of said body with said metal thereon to a second temperature which is substantially less than the lowest eutectic temperature for the silicides of said metal; and
   maintaining said second temperature for a time interval sufficiently long to form a silicide of said metal in said body.

2. A method according to claim 1 in which said second temperature is maintained over a time interval between about 2 minutes and about 15 minutes.

3. A method according to claim 1 in which said metal is palladium, said silicon is p-type having a resistivity of substantially 0.22 ohm-cm, and said second temperature is about 325°C.

4. A method according to claim 1 in which said metal is platinum, said silicon is p-type having a resistivity of substantially 0.22 ohm-cm, and said second temperature is about 425°C.

5. A method according to claim 1 in which said metal is hafnium, said silicon is n-type having a resistivity of substantially 0.22 ohm-cm, and said second temperature is about 400°C.

6. A method according to claim 1 in which said metal is deposited on said body to a thickness of approximately 2000A to 3000A.

7. A method according to claim 1 in which said second temperature is in the range between about 300°C and about 400°C.

8. A method according to claim 7 in which said second temperature is maintained over a time interval between about 2 minutes and about 15 minutes.

9. A method according to claim 1 in which said body is an epitaxial layer on a silicon substrate of lower resistivity, and said second temperature is discontinued before said silicide can penetrate said layer into said substrate.

10. A method according to claim 9 in which said second temperature is maintained over a time interval between about 2 minutes and about 15 minutes.

* * * * *